United States Patent
Orban

(10) Patent No.: US 6,205,225 B1
(45) Date of Patent: Mar. 20, 2001

(54) LOWER SIDEBAND MODULATION DISTORTION CANCELLATION

(75) Inventor: Robert Orban, Belmont, CA (US)

(73) Assignee: Orban, Inc., San Leandro, CA (US)

( * ) Notice: Subject to any disclaimer, the term of this patent is extended or adjusted under 35 U.S.C. 154(b) by 0 days.

(21) Appl. No.: 08/984,448

(22) Filed: Dec. 3, 1997

(51) Int. Cl.⁷ .................................................. H04B 15/00
(52) U.S. Cl. .............................................. 381/94.8; 381/106
(58) Field of Search ................................. 381/94.8, 94.1, 381/13, 94.2, 94.3, 71.1, 99, 106, 100, 98; 455/308, 309

(56) References Cited

U.S. PATENT DOCUMENTS 4,134,074  1/1979  Hershberger .
4,249,042  2/1981  Orban .
4,495,643  1/1985  Orban .
5,168,526  12/1992  Orban .

OTHER PUBLICATIONS

*Program EQFIR in PARKSMC.F*, Oct. 27, 1997, pp. 1–12.
S.K. Mitra & J.F. Kaiser, eds., *Handbook for Digital Signal Processing*, New York, Wiley, Jan. 1, 1993, p. 497.

*Primary Examiner*—Vivian Chang
(74) *Attorney, Agent, or Firm*—Blakely, Sokoloff, Taylor & Zafman LLP

(57) ABSTRACT

An audio peak limiter in which the lower sideband of the modulation distortion spectrum is canceled. The peak limiter is realized by multiplying the input signal by a control signal. The Hilbert transform of the control signal is multiplied by the Hilbert transform of the input signal and the outputs of the two multipliers are added. This cancels the lower sideband of the modulation process. Various filters can be added to eliminate aliasing in digital realizations, to band-limit the output signal, and to control peak overshoot.

14 Claims, 3 Drawing Sheets

LOWER SIDEBAND MODULATION DISTORTION CANCELLATION

BACKGROUND OF THE INVENTION

1. Field of the Invention

The invention relates to audio peak limiters and other audio control systems, more particularly to the cancellation of lower sideband modulation distortion in such systems.

2. Prior Art

Fast audio peak limiters include simple peak clippers, radio frequency clippers, Hilbert transform limiters as disclosed in U.S. Pat. No. 4,495,643, delay-line limiters, and others. Some of these operate directly on an input audio signal such as the simple peak clipper, which replaces any positive or negative instantaneous level exceeding a preset positive or negative threshold with the corresponding threshold value. Other peak limiters operate by multiplying a control signal by the input signal. All systems that operate directly on the signal have equivalent systems (producing the same outputs) that multiply the input signal by a control signal. U.S. Pat. No. 5,168,526 discusses how such an equivalent system can be synthesized.

Any system in which the input signal is multiplied by a control signal can be considered an amplitude modulator, where there are multiple "carriers" corresponding to each Fourier frequency component of the input signal and the "modulating signal" is the control signal. It is well known that amplitude modulators produce a pair of symmetrical, mirror-image sidebands on each side of the carrier. The frequencies in the upper sideband are the sum of the carrier and each Fourier frequency component in the modulating signal. The frequencies in the lower sideband are the difference between the carrier and each Fourier frequency component in the modulating signal. In the case of the peak limiting systems, the modulating process adds to each Fourier frequency component of the input signal a pair of sidebands corresponding to the frequency components in the control signal. This is true of all prior art processes enumerated above.

Psychoacoustic research has established that strong frequency components in an audio signal have the ability to "mask" weaker signals so they cannot be heard in the presence of the strong signals, although they would otherwise be audible in the absence of a strong signal. As the weak frequency becomes more distant in frequency from the strong signal, the strong signal must become stronger and stronger to mask the weak signal.

This effect is asymmetrical with frequency. Strong signals are more able to mask weak signals "x" octaves above a strong signal than to mask weak signals "x" octaves below a strong signal. Therefore, in any of the prior art peak limiting systems discussed, the lower sideband (representing distortion induced by the peak limiting process) is much more likely to be audible than is the upper sideband because the undistorted input signal is less able to psychoacoustically mask the lower sideband. This is particularly true because the lower sideband is arithmetically symmetrical to the upper sideband, occupying many more octaves than does the upper sideband.

SUMMARY OF THE INVENTION

In an audio system that controls an input audio signal to provide a controlled audio signal, a method is disclosed for canceling the lower sideband modulation distortion. A first signal is generated which is the Hilbert transform of a signal associated with the control of the input audio signal. A second signal representative of the Hilbert transform of the input audio signal is also generated. The first signal is then used to control the second signal such as in a multiplier to provide an output or third signal. This third signal is combined with the controlled audio signal. The combination, in effect, subtracts out the lower sideband modulation distortion.

An object of the invention is to reduce the audible modulation distortion caused by any audio compression, limiting, or gain control process by exploiting the frequency asymmetry of the psychoacoustic masking curves of the human ear.

A further object of the invention is to reduce aliasing distortion in sample-data realizations of compressors and limiters.

Yet another object of the invention is to produce a fast limiting process whose peak output level and output spectrum are both tightly constrained.

DETAILED DESCRIPTION OF THE PRESENT INVENTION

Figure 1:
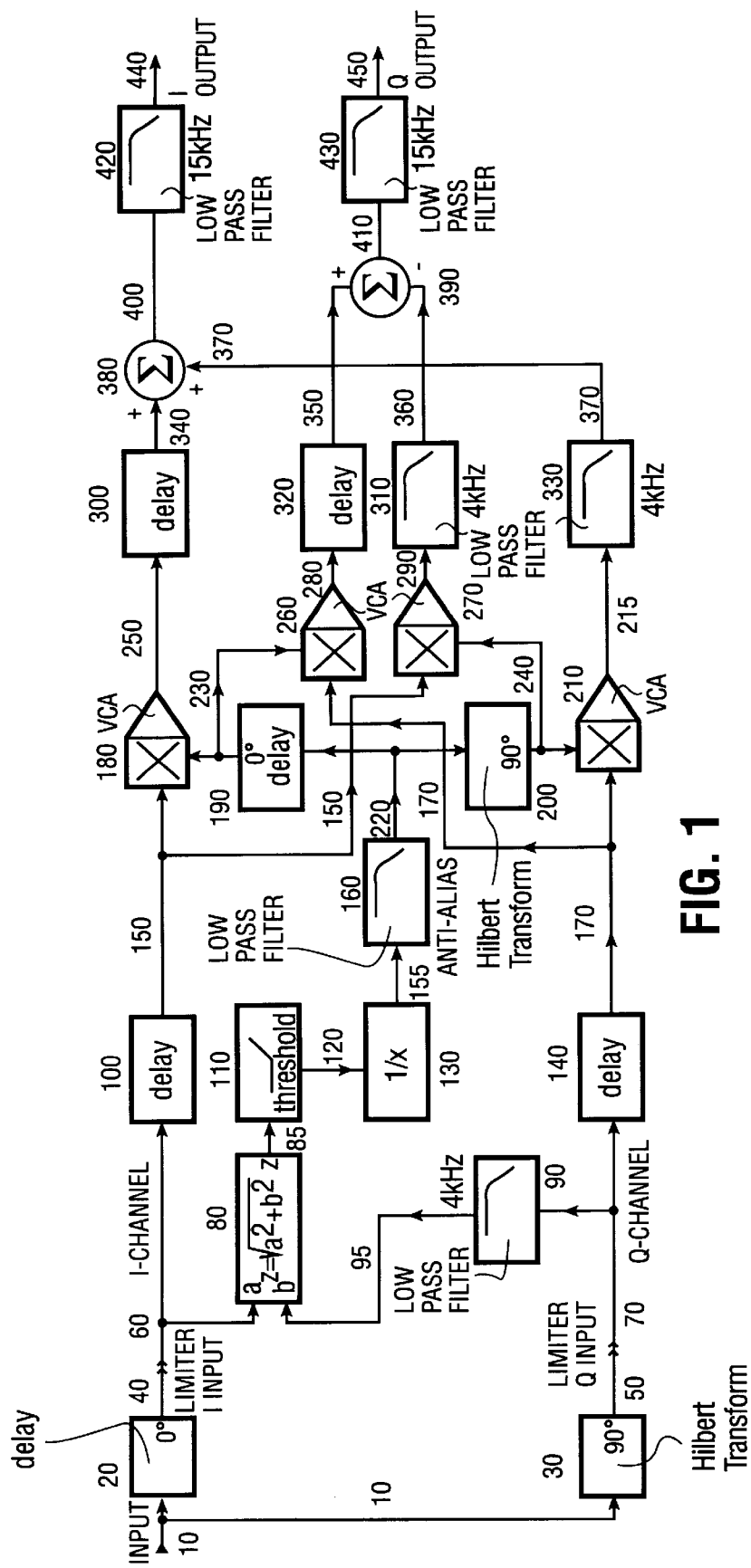
FIG. 1 is a block diagram of the first embodiment of an upper-sideband limiter that can control overshoot in accordance with the present invention above.

A method and apparatus for canceling lower sideband modulation distortion is described. In the following description, numerous specific details are set forth in order to provide a thorough understanding of the present invention. For instance, the present invention is discussed in connection with a peak limiter. It will be apparent to one skilled in the art that the present invention may be practiced without these specific details. In other instances, well-known circuits have not been shown in detail in order not to obscure the present invention.

In the following description and in the drawings like parts and signals lines have been shown with the same reference numbers to facilitate understanding of the various embodiments described below.

OVERVIEW OF THE PRESENT INVENTION FOR A PEAK LIMITER

An input audio signal is applied to a Hilbert transformer, which phase-shifts every Fourier component in the signal by 90 degrees. The input signal and its Hilbert transform are then applied to a level detector, which measures the peak level of the input signal. The preferred detector is the detectors disclosed in my U.S. Pat. No. 4,495,643, although other peak level detector can be used without losing the advantage of the present invention.

The output of the level detector is applied to a thresholding means, which determines the positive and negative peak thresholds beyond which the input signal will be limited. In most applications these thresholds will be symmetrical, but, in the case of amplitude-modulation radio broadcasting for example, they could be asymmetrical as well. The level detector's output signal is processed so that it will only affect the input signal when it exceeds the threshold.

In sampled-data systems the processed output of the level detector can be applied to a lowpass filter, whose cutoff frequency can be chosen so that the modulation sidebands do not alias back into the spectrum dedicated to the desired signal. (This filter is unnecessary if the sampling frequency is sufficiently high. This will be elaborated below.)

The processed output of the level detector is applied to a Hilbert transformer. The output of the Hilbert transformer is multiplied by the Hilbert transform of the input signal, and the processed output of the level detector is multiplied by the input signal. The outputs of the two multipliers are summed. This system forms a single-sideband modulator by the "phase-shift" method. (This phase-shift method is well known in the RF communications art). In the case of the current invention where each frequency component of the input signal acts as a separate "carrier," the system cancels the lower sidebands of the modulation products surrounding each "carrier." This reduces audible distortion by comparison to prior art systems because the "carriers" are the undistorted signal and are better able to psychoacoustically mask the upper sidebands of the modulation products than they are able to mask the lower sidebands.

Most communications systems require the output spectrum to be tightly bandlimited to prevent interference with other channels. This ordinarily requires the audio modulating signal's spectrum to have a well-defined upper frequency limit. The output of the system described immediately above contains frequency components as high as the sum of the highest frequency component of the input plus the highest frequency component in the modulating signal. The output of the system can be applied to a phase-linear lowpass filter to limit the bandwidth. However, this will remove spectral components that help reduce peak levels, causing peak overshoot. U.S. Pat. No. 4,134,074 and U.S. Pat. No. 4,249,042 describe two means of removing this overshoot with double-sideband limiters. In the present invention, two embodiments may be used to reduce overshoot while retaining the upper sideband property.

In a first embodiment, greater than unity gain is applied to the peak level detector so that in the absence of a lowpass filter at the output of the system, the peak levels would actually tend to decrease as the input levels increased above the threshold. In the second embodiment an error signal is produced by the multiplication process by subtracting the input of the multiplier from its output. This error signal is applied to a phase-linear lowpass filter with an output frequency response that rises at higher frequencies. The filtered error signal is then added to the input signal (delayed as much as the time delay of the rising-response lowpass filter), and this sum is used as the system output. Conceptually, this is similar to the embodiment in FIG. 5 of U.S. Pat. No. 4,249,042, and the filter can have a similar frequency response to filter 85 in that patent.

The first embodiment is the more economical system because it requires very little extra arithmetic computations. However, it is not frequency selective so it can increase distortion at low frequencies where no overshoot control is needed.

The second embodiment is more expensive than the first embodiment because it requires two filters. However, unlike the first embodiment, it does not increase distortion at low frequencies because the filter provides extra gain only where needed to control overshoot.

By changing the sign of the summation of the multiplier that processes the Hilbert transform of the input signal a system that produces only the lower sideband of the modulation distortion can be produced. While much more audible than the upper sideband, it is useful to use this to prevent the system from producing out-of-band spectral components.

FIRST EMBODIMENT (SYSTEM OF FIG. 1)

Referring to FIG. 1, the input signal on line 10 is applied to Hilbert transformer 30 and delay 20. All physical Hilbert transformers have time delay, the time delay in delay 20 is equal to the time delay in Hilbert transformer 30 plus the time delay in lowpass filter 90.

Almost any Hilbert transformer realization can be used for transformer 30. (U.S. Pat. No. 4,495,643 discusses this in more detail.) However, the higher audio quality is achieved by a linear-phase realization because this allows delay 20 to preserve the shape of the waveform on line 10. Such a realization is generally only practical in the sample-data domain and can be achieved by an antisymmetrical Finite Impulse Response (FIR) digital filter. The Parks, McClellan, and Rabiner algorithm can compute the tap weights for such a filter. (Program EQFIR in PARKSMC.F, Oct. 27, 1997, pp. 1–12.) Such filters have a bandpass characteristic, and a bandwidth wide enough for high-quality audio work (typically 30 to 15 kHz) is likely to result in a filter with several thousand taps. Such filters are most economically realized by the "fast convolution" technique, using the "overlap and add" or "overlap and save" methods to apply fast convolution to real-time signal. These methods are standard textbook methods in digital signal processing. (See, for example, S. K. Mitra & J. F. Kaiser, eds., *Handbook for Digital Signal Processing*, New York, Wiley, 1993, p 497.)

The preferred level detector is the same as the one described in U.S. Pat. No. 4,495,643. It is a vector sum generator 80 fed from the input signal on line 60 and 4 kHz lowpass filtered version of the Hilbert-transformed signal on line 95. The output of Hilbert transformer 30, line 70, is applied to 4 kHz lowpass filter 90 to achieve the lowpass filtering. In the preferred version this is a phase-linear FIR lowpass filter with integer-sample time delay so that its time delay can be absorbed in delay 20.

As described in U.S. Pat. No. 4,495,643, this results in no harmonic distortion for signals below 4 kHz, which makes processing of narrow band voice sources like optical film cleaner-sounding. In a sample-data system it has another advantage. The level detector 80 operates only on samples, so these samples do not necessarily coincide with the actual peak level of the signal applied to line 10. Further, level detector 80 is nonlinear, so its output spectrum contains intermodulation between the sampling frequency and frequencies present in the input on line 10. When the output of detector 80 is applied to thresholding circuit 110, this adds yet another layer of nonlinear processing and can introduce further intermodulation between the input signal and the sampling frequency. However, for a sinewave input below 4 kHz, the output of detector 80 on line 85 is a constant (DC) signal representing the true peak level of the sinewave present on line 10. Because the output is DC there is no intermodulation with the sampling frequency. This will continue to be true after this DC signal is processed by thresholding circuit 110 because the output of circuit 110 on line 120 will also be a DC signal.

Other level detectors can also be used without departing from the intent and advantages of the invention, although they may not have all of the advantages of the preferred embodiment described above. If line 95 is disconnected from level detector 80, then the system responds only to the delayed input signals on line 60 and is equivalent to a simple audio-frequency clipper (with lower-sideband distortion cancellation). It is equivalent to replacing level detector 80 with an absolute value detector.

Omitting lowpass filter 90 results in RF clipping at all frequencies, as described in U.S. Pat. No. 4,495,643. While this would appear to be an advantage (particularly with sample-data systems), it does not sound as good as the preferred embodiment when processing music because it produces more intermodulation distortion than does the preferred embodiment.

The output of level detector 80 on line 85 is applied to thresholding circuit 110. Thresholding circuit 110 computes threshold *{MAX[1, 1+k*(line 85−1)]}, where line 85 is the signal on line 85, threshold is the absolute value of the limiting threshold, MAX is an operator that outputs the greater of its two arguments, and k is a constant whose preferred value is 1.65 in the second embodiment shown in FIG. 1. k>1 is used in this embodiment for the overshoot compensator. It over-controls the signal by an amount proportional to k, compensating for overshoots caused by lowpass filters 420 and 430 but also increasing low-frequency distortion. If k=1, then thresholding circuit 110 reduces to computing threshold *[MAX(1, line 85)] and no overshoot compensation or excess low-frequency distortion are produced.

The output of thresholding circuit 110 on line 120 is applied to reciprocal generator 130 which conditions the control signal so that it can be multiplied by the input signal and thus control its peak level.

The output of reciprocal generator 130, line 155, is applied to anti-alias filter 160. This filter may be needed only in a sample-data (digital) realization. However, filter 160 is optional and is unnecessary if the sample frequency is sufficiently high. For example, in a system where the signal on line 10 has been band-limited to 15 kHz and the sample frequency is 64 kHz, filter 160 is unnecessary because the bandwidth of the signal on line 155 is intrinsically limited to 32 kHz. (A 64 kHz system cannot represent frequencies higher than one-half the sample frequency: 32 kHz.) Therefore, the worst-case alias associated with a 15 kHz Fourier component of the input signal on line 10 is 17 kHz. To elaborate: with no aliasing, the upper sideband produced by the modulation process in multipliers 180, 210, 260, and 290 would be 15 kHz+32 kHz=47 kHz. But 47 kHz cannot be represented in a system with 64 kHz sample rate, instead folding around 32 kHz to produce 32−(47−32)=17 kHz. This is 2 kHz beyond the desired 15 kHz bandwidth, and will therefore be eliminated by lowpass filters 420 and 430.

The output of lowpass filter 160 on line 220 sometimes referred to as the first signal, is applied to Hilbert transformer 200 and matching delay 190. Unlike Hilbert transformer 30, Hilbert transformer 200 is a phase-linear type to preserve the shape of the waveform on line 220 when it is passed through matching delay 190. The output of transformer 200 is sometimes referred to as the second signal. The prior comments on FIR Hilbert transformers above apply to the design of Hilbert transformer 200.

Meanwhile the unprocessed signal on line 60 passes through delay 100, while the Hilbert transform of the unprocessed signal on line 70 passes through delay 140. Delay 100 and delay 190 have the same time delay, equal to the excess time delay in Hilbert transformer 200. The time delay in delay 140 is equal to the excess time delay in Hilbert transformer 200 plus the time delay of lowpass filter 90.

The delayed, unprocessed signal on line 150 is applied to one input of multiplier 180. The delayed control signal on line 230 is applied to the other input of multiplier 180. Delay 300 receives the output of multiplier 180 on line 250 sometimes referred to as the controlled audio signal. The time delay of block 300 is equal to the time delay of filter 330. Adder 380 receives the output of delay 300 on line 340.

Meanwhile, the delayed Hilbert transform of the unprocessed signal on line 170 is applied to one input of multiplier 210. The Hilbert transform of the control signal on line 240 is applied to the other input of multiplier 210. The output of multiplier 210 on line 215 represents a distortion cancellation signal that, when added to the output of multiplier 180, cancels the lower sideband of any modulation distortion.

The signal on line 215 can have a large peak level because it cancels the lower sideband of any modulation distortion, including sidebands at very high frequencies. In peak limiters intended to control the peak modulation of systems using transmission pre-emphasis (like FM broadcast, television, and AM broadcast using "NRSC" pre-emphasis), the receiver incorporates deemphasis and thus rolls off high frequencies. Advantage is taken of this fact by canceling distortion only in the frequency range where the receiver has substantially flat frequency response. To do this, phase-linear lowpass filter 330 is inserted in line 215. Filter 330 has a preferred cutoff frequency of 4 kHz. It can reduce the peak level of the distortion cancellation signal on line 215 to between 25% and 50% of its original value, greatly improving the peak control of the limiting system while still canceling distortion in the frequency range that will be most noticeable at the receiver.

The output of filter 330 (sometimes referred to as the third signal) on line 370 is applied to adder 380 for combining with the signal on line 340, where lower sideband cancellation occurs throughout the passband frequency range of filter 330. Lowpass filter 420 receives the output of adder 380 on line 400 and eliminates frequencies above the desired passband of the transmission system. Filter 420 should have substantially constant time delay throughout its passband and can be a phase-linear FIR filter or a delay-equalized IIR filter.

The signal on line 440 will usually have significant residual overshoots because of the addition of the distortion cancellation signal on line 370 and because filter 420 will have overshoots that are not perfectly compensated by overshoot compensation schemes within the processing. To eliminate such overshoots, it is ordinarily necessary to cascade several stages of upper sideband clipping. An unlimited number of stages can be cascaded while still preserving the upper sideband property. To save the expense of deriving the Hilbert transform of each input signal (such as Hilbert transformer 30), the upper sideband limiter can be configured to have real ("I", for "in-phase") and imaginary ("Q", for "quadrature") outputs, where the imaginary output is the Hilbert transform of the real output. The real and imaginary outputs of one stage can be applied to the real and imaginary inputs of the succeeding stage. In FIG. 1, the "I" input would be the junction of line 40 and line 60, and the "I" output of a preceding stage on line 440 would be applied directly to line 60. Similarly, the "Q" output of a preceding stage would be applied directly to line 70.

The "Q" output of the upper sideband limiter appears on line 450. It is created by processing the "Q" signal on line 170 almost identically to the way the "I" signal on line 150 is processed. Multiplier 260 forms the product of the "Q" signal on line 170 and the control signal on line 230. Delay 320 receives this product on line 280 and applies it, delayed, to adder 390. Multiplier 270 forms the product of the "I"

signal on line 150 and the Hilbert transform of the control signal on line 240. 4 kHz lowpass filter 310 receives this signal on line 290, filters it, and applies it on line 360 to adder 390, where it is subtracted from the signal on line 350. Lowpass filter 430 (identical to lowpass filter 410) receives the output of adder 390 on line 410. The output of lowpass filter 430 on line 450 is the Hilbert transform of the signal on line 440.

Thus, the multipliers 260 and 270, delay 320, filter 310, summer 390 and filter 430 are not needed in the last stage of the limiter or in a single stage limiter.

SECOND EMBODIMENT (SYSTEM OF FIG. 2)

Figure 2:
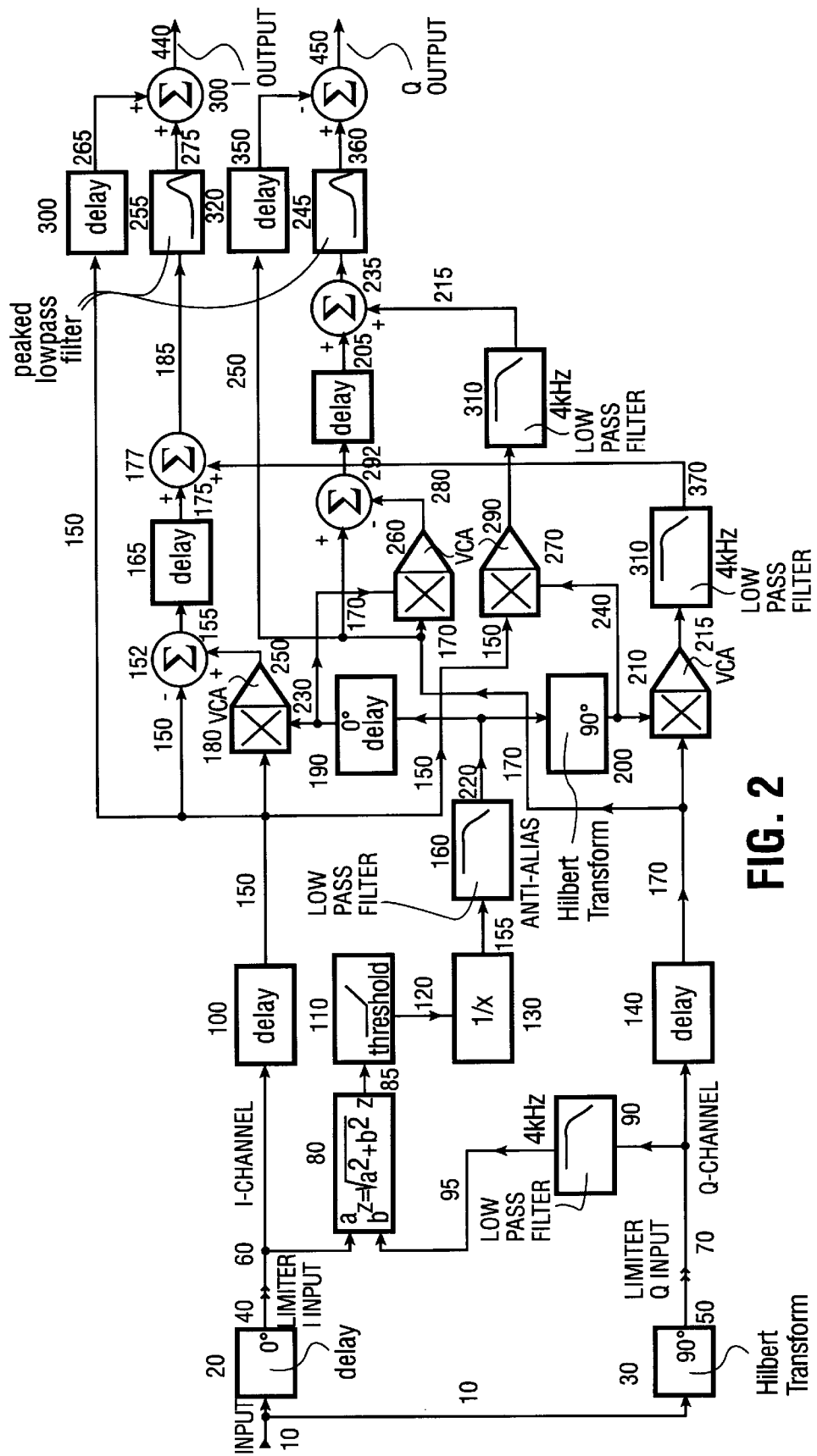
FIG. 2 is a block diagram of the second embodiment of an upper-sideband limiter that can control overshoot in accordance with the present invention above.

FIG. 2 shows the second embodiment of the present invention that achieves lower distortion at low frequencies at the expense of higher complexity. Only those parts of FIG. 2 that are different from FIG. 1 will be discussed below.

In FIG. 2, thresholding circuit 110 uses k=1, so there is no additional gain in the level detector and no additional low-frequency distortion. The added gain necessary for overshoot cancellation appears instead only at high frequencies as a result of the peaked frequency response of filters 245 and 255, as will be explained below.

In FIG. 1, the output of multiplier 180 on line 250 (the controlled audio signal) is applied to the system output through lowpass filter 420. In FIG. 2, subtractor 152 subtracts the input of multiplier 180 (on line 150) from its output on line 250. This signal on line 155 is the distortion added to the signal by the multiplier. If the signal on line 155 were to be directly added to the signal on line 150, the resulting signal would be the same as the signal on line 250. However, before this addition processing is used on the distortion signal on line 155. The signal first passes through delay 300, which is equal to the time delay of lowpass filter 330. The output of delay 300 (on line 175) is summed in adder 177 with the distortion-cancellation signal on line 370. This signal is generated the same way it is in FIG. 1. The lower sideband of the modulation distortion is canceled in adder 177.

The upper-sideband modulation distortion signal appears on line 185 and is applied to peaked lowpass filter 255. This filter has approximately constant time delay, approximately unity gain at low frequencies, and a peaked frequency response that is up approximately +4.5 dB at the cutoff frequency of the system (typically 15 or 20 kHz). It can be realized as an IIR filter cascaded with several stages of allpass delay correction. It therefore exaggerates high-frequency material below the system cutoff frequency, providing excess gain to help "push down" overshoots that would otherwise occur as a result of spectral truncation above the system cutoff frequency. Filter 255 is dominantly lowpass, also serving to perform such spectral truncation to band-limit the signal appearing on line 440. Since the spurious high frequency spectrum created by the system appears in the distortion signal on line 185, it is sufficient to band-limit only this signal to prevent the system from producing out-of-band spectrum. It is unnecessary to further filter the input signal, because it is assumed that this signal has already been adequately band-limited prior to its application to line 10. Because the main signal (on line 150) does not have to pass through filter 255, this means that the filter's specifications can be relaxed because it does not affect the overall frequency response of the processed signal when no limiting occurs. So filter 255 could have several tenths of a dB of passband ripple in its low-frequency "flat" region (below its high frequency peak) without significantly compromising system performance.

However, it does not depart from the spirit and intent of the invention to design filters 245 and 255 with a relatively gentle high-frequency rolloff (insufficient to appropriately band-limit the system), then placing additional band-limiting filters (equivalent to filters 420 and 430 in FIG. 1) in lines 440 and 450 of FIG. 2. This may be desirable if the system designer wants to apply some additional filtering to the unprocessed signal on line 10 to improve the suppression of out of-band spectrum.

After being processed by filter 255, the distortion signal on line 275 is combined with the unprocessed signal on line 265 in adder 300. The unprocessed signal on line 150 is delayed prior to this addition by delay 165. The time delay of delay 165 is equal to the sum of the time delay in delay 300 and the time delay through filter 255.

As was the case for the system of FIG. 1, the system of FIG. 2 can have processing to produce a "Q" output on line 450 that is the Hilbert transform of the signal on line 440. Except for sign changes in adders 172 and 285, this is virtually identical to the processing in the "I" channel discussed above and is apparent from examination of FIG. 2. Adder 172 corresponds to adder 152; adder 225 corresponds to adder 177; adder 285 corresponds to adder 300; delay 320 corresponds to delay 300; lowpass filter 310 corresponds to lowpass filter 330; lowpass filter 245 corresponds to lowpass filter 255; and delay 195 corresponds to delay 165.

In the case of the system of FIG. 2, the overhead required to produce the "Q" output is substantial because filter 245 is non-trivial. An alternative way of cascading the system of FIG. 2 is to compute only the "I" output and to use a Hilbert transformer to compute the Hilbert transform needed by the next system in the chain.

Similar to the system of FIG. 1, several systems of FIG. 2 can be cascaded. In fact, FIG. 1 and FIG. 2 systems can be mixed freely. An effective five-stage system for controlling peak levels with less than 3% overshoot consists of four cascaded FIG. 1 systems (the first two with k=1, the last two with k=1.65), followed by a double-sideband overshoot compensator of the type disclosed by Orban (U.S. Pat. No. 4,249,042) or Herschberger (U.S. Pat. No. 4,134,074). Because the final overshoot compensator does very little work, it does not produce audible distortion despite its lack of lower sideband distortion cancellation.

Another effective system consists of two systems of FIG. 2 cascaded, followed by a double sideband overshoot compensator.

The last upper-sideband limiter stage of a cascade ordinarily needs only an "I" output, which is either the actual peak-controlled output of the system or, more commonly, is applied to a double sideband overshoot compensator (which operates in real mode and thus cannot use the "Q" output of a previous stage). The only exception might be an overshoot compensator that uses a complex level detector like the one described in U.S. Pat. No. 4,495,643; this can exploit the "Q" output of a previous stage.

SYSTEM OF FIG. 3

Figure 3:
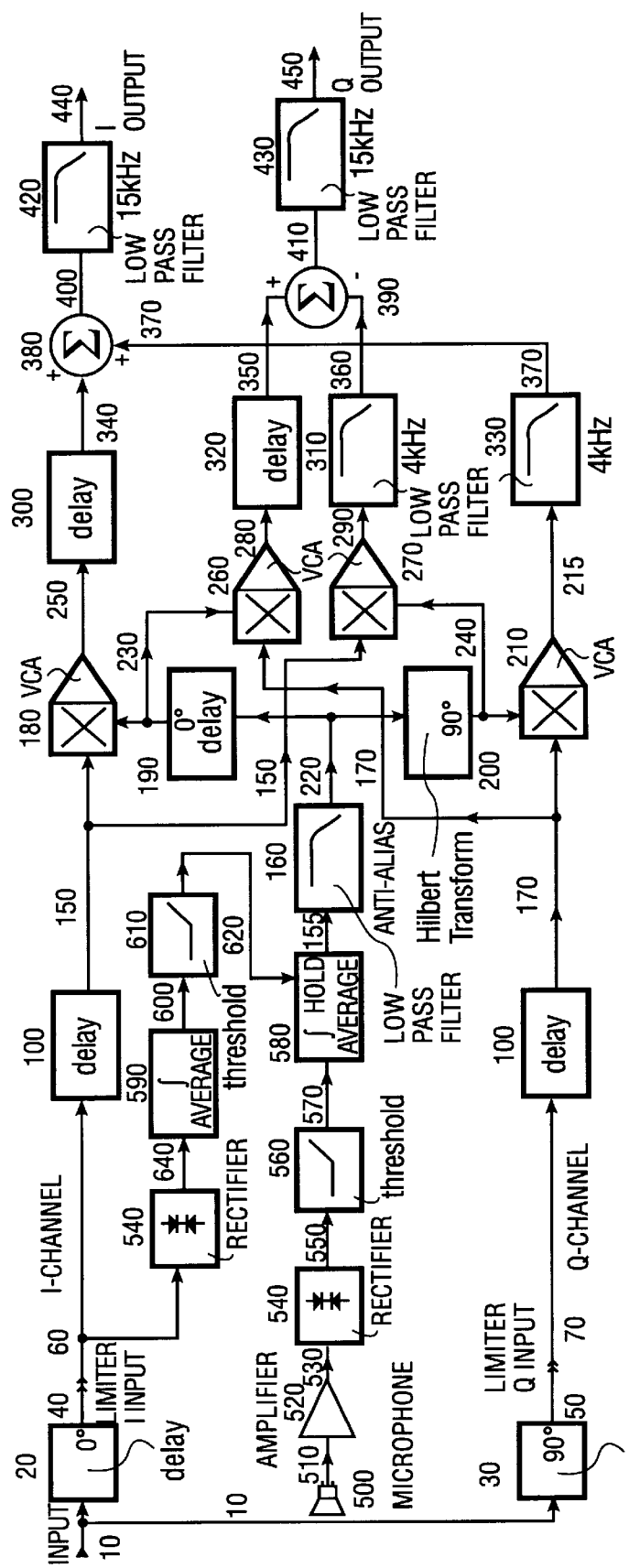
FIG. 3 is a block diagram of another audio system where the principles of the present invention are used.

In the embodiment of FIG. 3, the present invention is used to cancel the lower sideband modulation distortion which results when the gain of an audio signal, such as the audio signal used in a public address system, is controlled as a function of background noise. For instance, in an aircraft where the background noise may undergo large changes, it is desirable to have the audio level on the public address system change so as to maintain a comfortable listening level above the background noise.

In FIG. 3 the audio signal which is to be controlled is applied to line 10. Meanwhile, microphone 500 is placed in the environment to be served by the public address system to monitor the ambient noise. The output of microphone 500, line 510, is amplified by amplifier 520 and applied to a rectifier 540 to derive the absolute value of the signal. The rectified output, line 550, is applied to a thresholding circuit 560. The output of this circuit, line 570, is either a preset threshold or if the input signal to the threshold circuit exceeds the preset threshold, this excess signal is present on line 570. This threshold is needed to prevent the system from decreasing the gain excessively when the ambient noise is very low.

The signal on line 570 is applied to an average-with-hold circuit 580. This circuit determines the average value of the signal on line 570. If this signal applied to the circuit 580 exceeds the threshold set in the threshold circuit 610, then the output of the circuit 580, line 155 remains at its then current value.

The thresholding circuit 610 receives the average of the absolute value of the signal on line 60 as generated by the absolute value circuit 630 (such as a rectifier) and averaging means 590. It is the output of the threshold circuit 610 which activates the hold function in the averaging circuit 580. The purpose of this is to prevent the system from interpreting the output of a pubic address system as ambient noise. This would otherwise cause uncontrolled positive feedback as the gain of the system constantly increases to overcome the output of the public address system.

Note that in the circuit of FIG. 3 the inverse circuit 130 of FIGS. 1 and 2 is not present. This is because the system of FIG. 3 must respond to an increasing input on line 50 by increasing its gain, not decreasing it as is used in a peak limiting application. Otherwise, the circuit of FIG. 3 operates generally as described for the circuit of FIG. 1 and again, several stages may be employed.

Thus, an apparatus and method have been described in which the lower sidebands of a modulation distortion spectrum is canceled.

I claim:

1. In an audio system that controls an input audio signal to provide a controlled audio signal, a method for cancellation of lower sideband modulation distortion comprising:

generating a first signal which is a Hilbert transform of a signal associated with the control of the input audio signal;

generating a second signal representative of a Hilbert transform of the input audio signal;

multiplying the first signal and second signal to provide a third signal, and combining the third signal with the controlled audio signal.

2. The method defined by claim 1 including additionally multiplying the first signal and the input audio signal to provide the controlled audio signal.

3. The method defined by claims 1 or 3 wherein the signal associated with the control of the input audio signal is generated by:

finding the vector sum of the input signal and the second signal and using a threshold level in association with the vector sum.

4. The method defined by claim 3 including additionally generating a signal representative of the inverse of a signal resulting from the vector sum and threshold level.

5. The method defined by claim 1 wherein the first signal is multiplied by the input audio signal to provide a Q output which is used in a second stage of an audio system for cancellation of lower sideband modulation distortion.

6. The method of claim 1 repeated in cascade on the input audio signal.

7. The method defined by claim 1 including reducing peak overshoot to the combination of the third signal and the controlled audio signal.

8. In an audio system where a control signal is used to control the gain of an audio signal to provide a controlled audio signal, a method for cancellation of lower sideband modulation distortion comprising:

generating a first signal representative of the Hilbert transform of the control signal;

multiplying the first signal and a second signal, the second signal representing the Hilbert transform of the audio signal, to provide a third signal; and combining at least part of the third signal with the controlled audio signal.

9. The method defined by claim 8 including low-pass filtering a signal resulting from the combining step.

10. The method defined by claim 9 including forming the vector sum of the second signal and the audio signal, and using the inverse of the portion of the vector sum exceeding a threshold level as the control signal.

11. The method defined by claims 8 or 10 repeated in cascade on the audio signal.

12. In a peak limiting apparatus, where an input audio signal (a) and the Hilbert transform signal (b) of the input audio signal are used to develop the signal $z=\sqrt{a^2+b^2}$, and where z exceeds a predetermined threshold resulting in x and additionally where x is used to develop a control signal 1/x and, further where 1/x is multiplied with the input audio signal for peak limiting, an improvement comprising:

a Hilbert transform means which receives the signal 1/x and provides an output signal;

a multiplier for multiplying the output signal of the Hilbert transform means with the signal (b) to provide a third signal, coupled to the Hilbert transform means; and a combining means for combining the output of the multiplier with the third signal, coupled to the multiplier.

13. The apparatus defined by claim 12 also including a means for reducing peak overshoot coupled to the combining means.

14. An apparatus for limiting peaks of an audio signal comprising a plurality of the improvement defined by claim 12 coupled in cascade.

* * * * *